United States Patent
Lee

(10) Patent No.: US 10,418,558 B2
(45) Date of Patent: Sep. 17, 2019

(54) ORGANIC LIGHT EMITTING DISPLAY DEVICE INCLUDING A P-TYPE DOPANT IN AN ELECTRON TRANSPORT LAYER

(71) Applicant: SAMSUNG DISPLAY CO., LTD., Yongin-si, Gyeonggi-do (KR)

(72) Inventor: Heun Seung Lee, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/596,025

(22) Filed: May 16, 2017

(65) Prior Publication Data
US 2018/0006224 A1 Jan. 4, 2018

(30) Foreign Application Priority Data
Jul. 4, 2016 (KR) .................. 10-2016-0084251

(51) Int. Cl.
*H01L 51/00* (2006.01)
*H01L 51/50* (2006.01)
*H01L 27/32* (2006.01)

(52) U.S. Cl.
CPC ........ *H01L 51/005* (2013.01); *H01L 51/0072* (2013.01); *H01L 51/508* (2013.01); *H01L 27/3248* (2013.01); *H01L 27/3262* (2013.01); *H01L 27/3276* (2013.01); *H01L 51/5056* (2013.01); *H01L 51/5076* (2013.01); *H01L 51/5092* (2013.01)

(58) Field of Classification Search
None
See application file for complete search history.

(56) References Cited

U.S. PATENT DOCUMENTS

| | | | |
|---|---|---|---|
| 7,956,349 B2* | 6/2011 | Tsutsui | B82Y 10/00 257/40 |
| 8,648,384 B2 | 2/2014 | Na et al. | |
| 9,269,919 B2 | 2/2016 | Joo et al. | |
| 9,508,950 B2 | 11/2016 | Joo et al. | |
| 2005/0100068 A1* | 5/2005 | Jikutani | B82Y 20/00 372/46.01 |
| 2006/0017055 A1* | 1/2006 | Cropper | H01L 51/56 257/77 |
| 2006/0244370 A1* | 11/2006 | Tyan | H01L 51/5265 313/506 |
| 2008/0123179 A1* | 5/2008 | Harada | G02F 1/132 359/321 |
| 2014/0124747 A1* | 5/2014 | Hwang | H01L 51/0061 257/40 |
| 2014/0239285 A1* | 8/2014 | Wang | H01L 51/5076 257/40 |

(Continued)

FOREIGN PATENT DOCUMENTS

KR 10-2013-0013869 A 2/2013
KR 10-2014-0142462 A 12/2014

(Continued)

*Primary Examiner* — Bilkis Jahan
(74) *Attorney, Agent, or Firm* — Lee & Morse, P.C.

(57) ABSTRACT

An organic light emitting display device includes: an anode electrode; a cathode electrode; an emitting layer disposed between the anode electrode and the cathode electrode; and an electron transport layer disposed between the cathode electrode and the emitting layer, the electron transport layer including a p-type dopant.

11 Claims, 9 Drawing Sheets

(56) References Cited

U.S. PATENT DOCUMENTS

2015/0188066 A1\* 7/2015 Song .................... H01L 51/002
                                                    257/40

FOREIGN PATENT DOCUMENTS

| KR | 10-1512229 B1 | 4/2015 |
| KR | 10-1561554 B1 | 10/2015 |
| KR | 10-1649473 B1 | 8/2016 |
| KR | 10-1677918 B1 | 11/2016 |

\* cited by examiner

ORGANIC LIGHT EMITTING DISPLAY DEVICE INCLUDING A P-TYPE DOPANT IN AN ELECTRON TRANSPORT LAYER

CROSS-REFERENCE TO RELATED APPLICATION

Korean Patent Application No. 10-2016-0084251, filed on Jul. 4, 2016, in the Korean Intellectual Property Office, and entitled: "Organic Light Emitting Display Device," is incorporated by reference herein in its entirety.

BACKGROUND

1. Field

Embodiments relate to an organic light emitting display device.

2. Description of the Related Art

An organic light emitting display device may include an anode electrode, a cathode electrode, and an organic light emitting layer located between the anode electrode and the cathode electrode. In the organic light emitting display device, holes injected from the anode electrode and electrons injected from the cathode electrode are combined in the organic light emitting layer so as to form excitons, and the excitons emit light through energy emission.

SUMMARY

Embodiments are directed to an organic light emitting display device.

The embodiments may be realized by providing an organic light emitting display device including an anode electrode; a cathode electrode; an emitting layer between the anode electrode and the cathode electrode; and an electron transport layer between the cathode electrode and the emitting layer, wherein the electron transport layer includes a p-type dopant.

The p-type dopant may be included in the electron transport layer in an amount of 1 wt % to 2 wt %, based on a total weight of the electron transport layer.

The p-type dopant may include 1,4,5,8,9,11-hexaazatriphenylene-hexacarbonitrile (HAT-CN), NDP9, 2,3,5,6-tetrafluoro-7,7,8,8-tetracyanoquinodimethane (F4-TCNQ), a tetracyanoquinodimethane compound, iodine, $V_2O_5$, $FeCl_3$, $FeF_3$, or $SbCl_5$.

The embodiments may be realized by providing an organic light emitting display device including an anode electrode; a cathode electrode; an emitting layer between the anode electrode and the cathode electrode; and an electron transport layer between the cathode electrode and the emitting layer, wherein the electron transport layer includes a first electron transport layer between the cathode electrode and the emitting layer; and a second electron transport layer between the cathode electrode and the first electron transport layer, wherein at least one of the first electron transport layer and the second electron transport layer includes a p-type dopant.

The first electron transport layer may include the p-type dopant.

The p-type dopant may be included in the first electron transport layer in an amount of 1 wt % to 2 wt %, based on a total weight of the first electron transport layer.

The second electron transport layer may include the p-type dopant.

The electron transport layer may further include a third electron transport layer between the second electron transport layer and the cathode electrode.

The p-type dopant is included in the second electron transport layer in an amount of 1 wt % to 2 wt %, based on a total weight of the second electron transport layer.

The p-type dopant may include 1,4,5,8,9,11-hexaazatriphenylene-hexacarbonitrile (HAT-CN), NDP9, 2,3,5,6-tetrafluoro-7,7,8,8-tetracyanoquinodimethane (F4-TCNQ), a tetracyanoquinodimethane compound, iodine, $V_2O_5$, $FeCl_3$, $FeF_3$, or $SbCl_5$.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
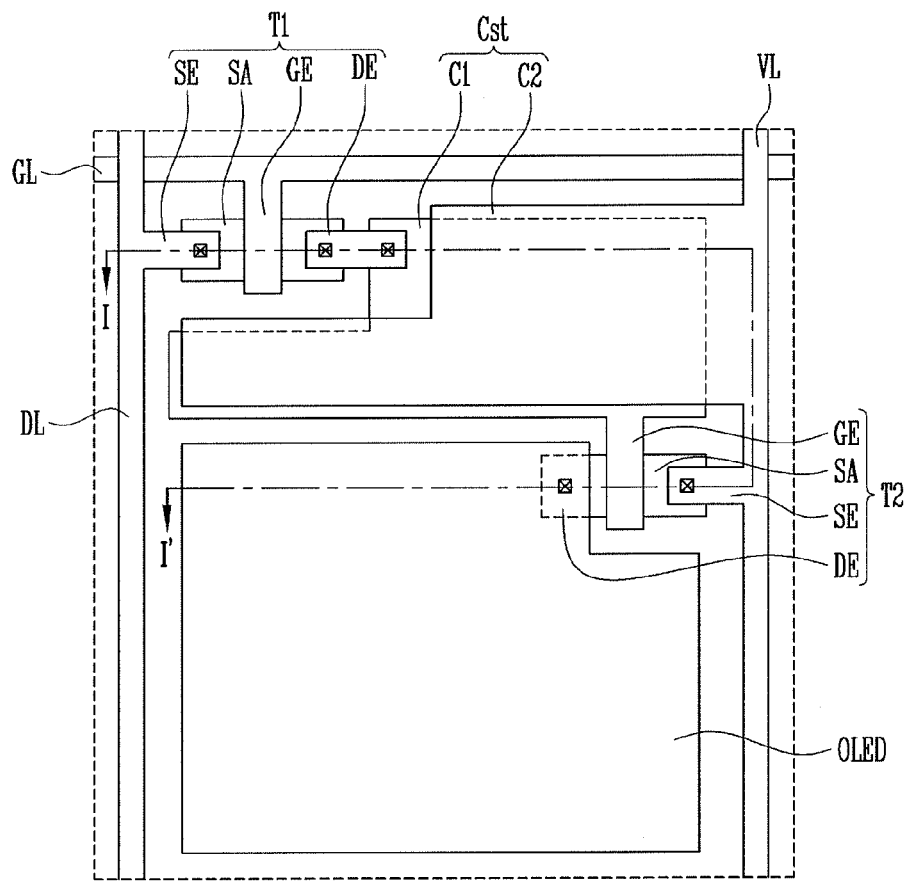
FIG. 1 illustrates a plan view of an organic light emitting display device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, exemplary embodiments of the present disclosure will be described in detail with reference to the accompanying drawings.

Figure 2:
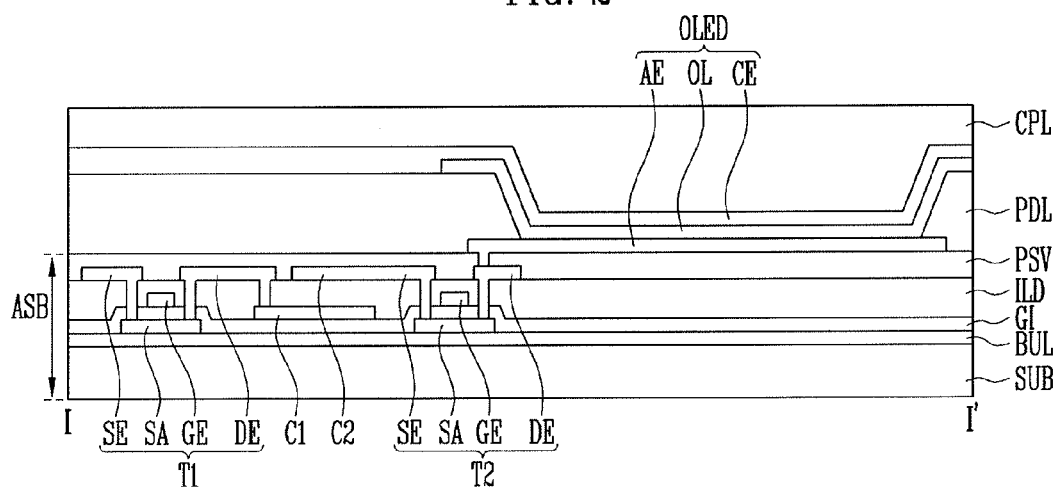
FIG. 2 illustrates a sectional view taken along line I-I' of FIG. 1.

FIG. 1 illustrates a plan view of an organic light emitting display device according to an embodiment of the present disclosure. FIG. 2 illustrates a sectional view taken along line I-I' of FIG. 1.

Referring to FIGS. 1 and 2, the organic light emitting display device may include an array substrate ASB, an organic light emitting device OLED disposed on the array substrate ASB, and a capping layer CPL covering the organic light emitting device OLED.

The array substrate ASB may include a base substrate SUB, and a first thin film transistor T1, a second thin film transistor T2, and a capacitor Cst, which are disposed on the base substrate SUB.

The base substrate SUB may include a transparent insulating material such that light can be transmitted therethrough. In an implementation, the base substrate SUB may be a rigid substrate. For example, the base substrate SUB may be one of a glass base substrate, a quartz base substrate, a glass ceramic base substrate, and a crystalline glass base substrate.

In an implementation, the base substrate SUB may be a flexible substrate. Here, the base substrate SUB may be one of a film substrate including a polymer organic material and a plastic substrate. For example, the base substrate SUB may include polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), or cellulose acetate propionate (CAP). In an implementation, the base substrate SUB may include a fiber reinforced plastic (FRP).

A material applied to the base substrate SUB may have resistance (or thermal resistance) to high processing temperature in a process of manufacturing the organic light emitting display device.

One of the first thin film transistor T1 and the second thin film transistor T2, e.g., the first thin film transistor T1 may be a switching device. Therefore, the first thin film transistor T1 may be connected to a gate line GL and a data line DL.

The other of the first thin film transistor T1 and the second thin film transistor T2, e.g., the second thin film transistor T2 may be a driving device. Therefore, the second thin film transistor T2 may be connected to the capacitor Cst and a power supply line VL.

Each of the first thin film transistor T1 and the second thin film transistor T2 may include a semiconductor layer SA, a gate electrode GE insulated from the semiconductor layer SA, and a source electrode SE and a drain electrode DE, which are connected to the semiconductor layer SA.

The semiconductor layer SA may be disposed on the base substrate SUB. The semiconductor layer SA may include one of amorphous silicon (a-Si), a polycrystalline silicon (p-Si), oxide semiconductor, and organic semiconductor. Here, the oxide semiconductor may include at least one of Zn, In, Ga, Sn or any mixture thereof. For example, the oxide semiconductor may include indium-gallium-zinc oxide (IGZO).

In the semiconductor layer SA, a region in contact with the source electrode SE and the drain electrode DE may be a source region and a drain region, into which impurities are doped or injected. In addition, a region between the source area and the drain area may be a channel region.

In an implementation, when the semiconductor layer SA includes an oxide semiconductor, a light blocking layer for blocking light incident into the semiconductor layer SA may be disposed at upper and lower portions of the semiconductor layer SA.

A buffer layer BUL may be disposed between the base substrate SUB and the semiconductor layer SA. The buffer layer BUL may include at least one of silicon oxide ($SiO_x$) and silicon nitride ($SiN_x$). For example, the buffer layer BUL may include a first layer including silicon oxide, and a second layer disposed on the first layer, the second layer including silicon nitride. In an implementation, the buffer layer BUL may include silicon oxynitride (SiON). The buffer layer BUL may help prevent impurities from being diffused into the semiconductor layer SA of each of the first thin film transistor T1 and the second thin film transistor T2 from the base substrate SUB, thereby preventing deterioration of electrical characteristics of the first thin film transistor T1 and the second thin film transistor T2.

Also, the buffer layer BUL may help prevent moisture and oxygen from penetrating into the organic light emitting device OLED from the outside. The buffer layer BUL may planarize a surface of the base substrate SUB.

A gate insulating layer GI covering the semiconductor layer SA may be disposed on the base substrate SUB and the semiconductor layer SA. The gate insulating layer GI may insulate the semiconductor layer SA and the gate electrode GE from each other. The gate insulating layer GI may include at least one of silicon oxide and silicon nitride.

The gate line GL extending in one direction, the gate electrode GE, and a first capacitor electrode C1 of the capacitor Cst may be disposed on the gate insulating layer GI.

An interlayer insulating layer ILD may be disposed on the gate insulating layer GI, the gate line GL, the gate electrode GE, and the first capacitor electrode C1. For example, the interlayer insulating layer ILD may cover the gate electrode GE. Like the gate insulating layer GI, the interlayer insulating layer ILD may include at least one of silicon oxide and silicon nitride. In addition, a portion of the interlayer insulating layer ILD may be removed, to expose the source and drain regions of the semiconductor layer SA therethrough.

The data line DL intersecting the gate line GL while being insulated from the gate line GL, the power supply line VL disposed to be spaced apart from the data line DL, a second capacitor electrode C2 of the capacitor Cst, the source electrode SE, and the drain electrode DE may be disposed on the interlayer insulating layer ILD.

The source electrode SE and the drain electrode DE may be insulated from the gate electrode GE by the interlayer insulating layer ILD. Also, the source electrode SE and the drain electrode DE may be connected to the source region and the drain region, respectively.

In an implementation, both of the second thin film transistor T2 and the first thin film transistor T1 may be thin film transistors having a top gate structure. In an implementation, at least one of the second thin film transistor T2 and the first thin film transistor T1 may be a thin film transistor having a bottom gate structure.

The capacitor Cst may include the first capacitor electrode C1 and the second capacitor electrode C2. The first capacitor electrode C1 may include the same material as the gate line GL and the gate electrode GE. The first capacitor electrode C1 may be disposed in the same layer as the gate line GL and the gate electrode GE.

The second capacitor electrode C2 may include the same material as the data line DL, the power supply line VL, the source electrode SE, and the drain electrode DE. The second capacitor electrode C2 may be disposed in the same layer as the data line DL, the power supply line VL, the source electrode SE, and the drain electrode DE.

A protective layer PSV may be disposed on the base substrate SUB on which the first thin film transistor T1, the second thin film transistor T2, and the capacitor Cst are disposed. That is, the protective layer PSV may cover the first thin film transistor T1, the second thin film transistor T2, and the capacitor Cst. Also, the protective layer PSV may expose a portion of the drain electrode DE of the second thin film transistor T2 therethrough.

The protective layer PSV may include at least one layer. For example, the protective layer PSV may include at least one of an inorganic protective layer and an organic protective layer. For example, the protective layer PSV may include an inorganic protective layer covering the first thin film transistor T1, the second thin film transistor T2, and the capacitor Cst, and an organic protective layer disposed on the inorganic protective layer.

The inorganic protective layer may include at least one of silicon oxide and silicon nitride. In an implementation, the organic protective layer may include an organic insulating material capable of allowing light to be transmitted therethrough. For example, the organic protective layer may include at least one of polyacrylate resin, epoxy resin, phenolic resin, polyamide resin, polyimide resin, unsaturated polyester resin, polyphenylene ether resin, polyphenylene sulfide resin, and benzocyclobutene resin.

The organic light emitting device OLED connected to the drain electrode DE of the second thin film transistor T2 may be disposed on the protective layer PSV.

The organic light emitting device OLED may include a first electrode AE connected to the drain electrode DE of the second thin film transistor T2, an organic layer OL disposed on the first electrode AE, and a second electrode CE disposed on the organic layer OL.

One of the first electrode AE and the second electrode CE may be an anode electrode, and the other of the first electrode AE and the second electrode CE may be a cathode electrode. For example, the first electrode AE may be an anode electrode, and the second electrode CE may be a cathode electrode.

In addition, at least one of the first electrode AE and the second electrode CE may be a transmissive electrode. For example, when the organic light emitting device OLED is a bottom emission type organic light emitting device, the first electrode AE may be a transmissive electrode, and the second electrode CE may be a reflective electrode. When the organic light emitting device OLED is a top emission type organic light emitting device, the first electrode AE may be a reflective electrode, and the second electrode CE may be a transmissive electrode. When the organic light emitting device OLED is a double-sided emission type organic light emitting device, both of the first electrode AE and the second electrode CE may be transmissive electrodes. In this embodiment, a case where the first electrode AE is an anode electrode, and the organic light emitting device OLED is a top emission type organic light emitting device is described as an example.

The first electrode AE may be disposed on the protective layer PSV. In an implementation, the first electrode AE may include a reflective layer capable of reflecting light, and a transparent conductive layer disposed on the top or bottom of the reflective layer. At least one of the reflective layer and the transparent conductive layer may be connected to the drain electrode DE of the second thin film transistor T2.

The reflective layer may include a material capable of reflecting light. For example, the reflective layer may include aluminum (Al), silver (Ag), chromium (Cr), molybdenum (Mo), platinum (Pt), nickel (Ni), or an alloy thereof.

The transparent conductive layer may include transparent conductive oxide. For example, the transparent conductive layer may include indium tin oxide (ITO), indium zinc oxide (IZO), aluminum zinc oxide (AZO), gallium doped zinc oxide (GZO), zinc tin oxide (ZTO), gallium tin oxide (GTO), or fluorine doped tin oxide (FTO).

A pixel defining layer PDL may be disposed on the first electrode AE and the protective layer PSV. The pixel defining layer PDL may expose a portion of the first electrode AE therethrough. For example, the pixel defining layer PDL may have a shape covering an edge of the first electrode AE and the protective layer PSV.

The pixel defining layer PDL may include an organic insulating material. For example, the pixel defining layer PDL may include polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), a siloxane based resin, or a silane based resin.

The organic layer OL may have a multi-layered thin film structure at least including an emitting layer (EML). For example, the organic layer OL may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the EML, the EML for emitting light through the re-combination of the injected electrons and holes, an electron transport layer (ETL) for smoothly transporting electrons to the EML, and an electron transport layer (EIL) for injecting electrons. In an implementation, the color of light generated in the EML may be one of red, green, blue, and white. In an implementation, the color of light generated in the EML of the organic layer OL may be one of magenta, cyan, and yellow.

The second electrode CE may be disposed on the organic layer OL. The second electrode CE may be a semi-transmissive reflective layer. For example, the second electrode CE may be a thin metal layer having a thickness, through which light can be transmitted. The second electrode CE may transmit a portion of the light emitted from the organic layer OL therethrough, and may reflect the rest of the light emitted from the organic layer OL. The light reflected from the second electrode CE may be reflected from the reflective layer of the first electrode AE to be transmitted through the second electrode CE due to constructive interference.

The second electrode CE may include a material having a low work function as compared with the transparent conductive layer of the first electrode AE. For example, the second electrode CE may include molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof.

The capping layer CPL may isolate or protect the organic light emitting device OLED from an external environment. Thus, the capping layer CPL may be disposed on the second electrode CE, to help prevent moisture and oxygen from penetrating into the organic light emitting device OLED.

The capping layer CPL may be a thin film encapsulation layer including a plurality of inorganic layers and a plurality of organic layers, which cover the organic light emitting device OLED. For example, the capping layer CPL may have a structure in which the inorganic layers and the organic layers are alternately stacked. In an implementation, the lowermost and uppermost layers of the capping layer CPL may be inorganic layers.

The inorganic layer may include, e.g., silicon oxide (SiOx), silicon nitride (SiNx), silicon oxynitride (SiON), aluminum oxide ($Al_2O_3$), titanium oxide ($TiO_2$), zirconium oxide (ZrOx), or tin oxide (ZnO).

Figure 3:
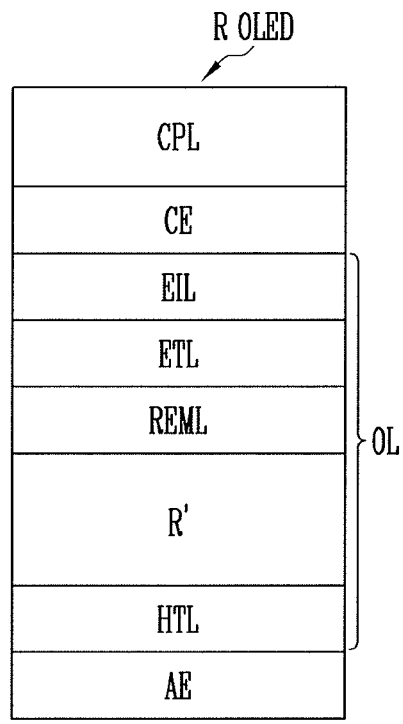
FIG. 3 illustrates a sectional view of a red organic light emitting device.
Figure 4:
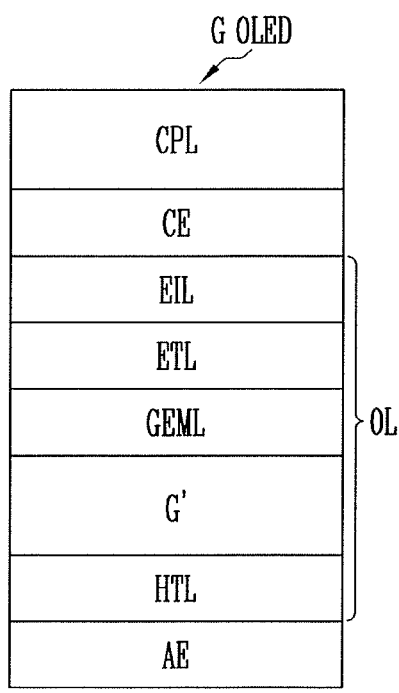
FIG. 4 illustrates a sectional view of a green organic light emitting device.
Figure 5:
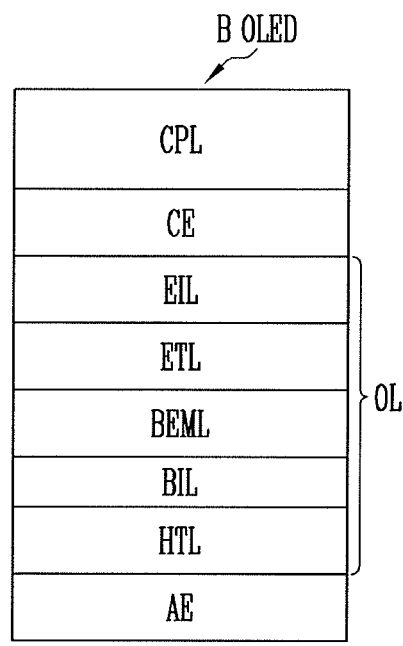
FIG. 5 illustrates a sectional view of a blue organic light emitting device.

FIG. 3 illustrates a sectional view illustrating a red organic light emitting device. FIG. 4 illustrates a sectional view illustrating a green organic light emitting device. FIG. 5 illustrates a sectional view illustrating a blue organic light emitting device.

Referring to FIGS. 3 to 5, each of the red organic light emitting device R OLED, the green organic light emitting device G OLED, and the blue organic light emitting device B OLED may include a first electrode AE, an organic layer OL disposed on the first electrode AE, and a second electrode CE disposed on the organic layer OL. In addition, a capping layer CPL that isolates each of the red organic light emitting device ROLED, the green organic light emitting device GOLED, and the blue organic light emitting device BOLED from an external environment may be disposed on the second electrode CE.

The first electrode AE may be an anode electrode, and may supply holes to the organic layer OL. The first electrode AE may include a reflective layer capable of reflecting light, and a transparent conductive layer disposed at an upper or lower portion of the reflective layer. The reflective layer may include a material capable of reflecting light, and the transparent conductive layer may include transparent conductive oxide.

The organic layer OL may include a hole transport layer HTL disposed on the first electrode AE, an emitting layer REML, GEML, or BEML disposed on the hole transport layer HTL, an electron transport layer ETL disposed on the emitting layer REML, GEML, or BEML, and an electron injection layer EIL disposed on the electron transport layer ETL. Here, the hole transport layer HTL, the electron transport layer ETL, and the electron injection layer EIL may be common layers that are identically applied to the red organic light emitting device ROLED, the green organic light emitting device GOLED, and the blue organic light emitting device BOLED.

The hole transport layer HTL may transfer holes supplied from the first electrode AE to the emitting layer REML, GEML, or BEML. The hole transport layer HTL may include a suitable hole transport material known in the art. For example, the hole transport layer HTL may include 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalen-1-yl)-N,N'-diphenyl benzidine (NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine) (TFB), or poly(9,9-dioctylfluorene-co-bis-N,N-phenyl-1,4-phenylenediamine) (PFB). In an implementation, the hole transport layer HTL may include a p-type dopant so as to geko improve hole transfer efficiency.

In an implementation, a hole injection layer for injecting holes may be disposed between the hole transport layer HTL and the first electrode AE.

When an energy level of excitons formed by combining holes and electrons, respectively supplied from the first electrode AE and the second electrode CE, is changed from an excited state to a ground state, the emitting layer EML of each of the red organic light emitting device ROLED, the green organic light emitting device GOLED, and the blue organic light emitting device BOLED may emit light having a color corresponding to the changed energy level. For example, the emitting layer REML of the red organic light emitting device ROLED may emit red light, the emitting layer GEML of the green organic light emitting device GOLED may emit green light, and the emitting layer BEML of the blue organic light emitting device BOLED may emit blue light.

The emitting layer REML of the red organic light emitting device ROLED may include one of a high-molecular organic material, a low-molecular organic material, and a mixture thereof, of which inherent light emitting color is red. In an implementation, the emitting layer REML of the red organic light emitting device ROLED may include a red host material and a red dopant.

The emitting layer GEML of the green organic light emitting device GOLED may include one of a high-molecular organic material, a low-molecular organic material, and a mixture thereof, of which inherent light emitting color is green. In an implementation, the emitting layer GEML of the green organic light emitting device GOLED may include a green host material and a green dopant.

The emitting layer BEML of the blue organic light emitting device BOLED may include one of a high-molecular organic material, a low-molecular organic material, and a mixture thereof, of which inherent light emitting color is blue. In an implementation, the emitting layer BEML of the blue organic light emitting device BOLED may include a blue host material and a blue dopant.

Meanwhile, a portion of light emitted from the emitting layer REML, GEML, or BEML of each of the red organic light emitting device ROLED, the green organic light emitting device GOLED, and the blue organic light emitting device BOLED may be transmitted through the second electrode CE. However, light that is emitted from the emitting layer REML, GEML, or BEML but is not transmitted through the second electrode CE may be reflected from the second electrode CE and again reflected from the reflective layer of the first electrode AE. Therefore, the light that is emitted from the emitting layer REML, GEML, or BEML but is not transmitted through the second electrode CE may resonate between the second electrode CE and the reflective layer. When the light resonating between the second electrode CE and the reflective layer satisfies a constructive interference condition, the light may be transmitted through the second electrode CE. Thus, the luminance of light emitted from the red organic light emitting device ROLED, the green organic light emitting device GOLED, and the blue organic light emitting device BOLED may be increased.

Among the red organic light emitting device ROLED, the green organic light emitting device GOLED, and the blue organic light emitting device BOLED, the wavelength of red light emitted from the red organic light emitting device RULED is longest, and the wavelength of blue light emitted from the blue organic light emitting device BOLED is shortest. Therefore, a distance between the second electrode CE and the reflective layer in each of the red organic light emitting device RULED, the green organic light emitting device GOLED, and the blue organic light emitting device BOLED may be differently set. For example, as a thickness of the emitting layer REML of the red organic light emitting device RULED among the red organic light emitting device RULED, the green organic light emitting device GOLED, and the blue organic light emitting device BOLED becomes largest, a distance between the second electrode CE and the reflective layer in the red organic light emitting device RULED among the red organic light emitting device RULED, the green organic light emitting device GOLED, and the blue organic light emitting device BOLED may be largest. In addition, as a thickness of the emitting layer BEML of the blue organic light emitting device BOLED among the red organic light emitting device RULED, the green organic light emitting device GOLED, and the blue organic light emitting device BOLED becomes smallest, a distance between the second electrode CE and the reflective layer in the blue organic light emitting device BOLED among the red organic light emitting device RULED, the green organic light emitting device GOLED, and the blue organic light emitting device BOLED may be smallest.

The electron transport layer ETL may transport electrons injected from the second electrode CE to the emitting layer REML, GEML, or BEML. The electron transport layer ETL may include at least one of quinoline derivatives, e.g., tris(8-quinolinolate)aluminum Alq3, TAZ, and Balq. In an implementation, the electron transport layer ETL may include an n-type dopant. The n-type dopant may include at least one of metal salt, metal oxide, and organic metal salt. The metal salt may include one of an alkali metal and a halide of an alkaline earth metal. In an implementation, the halide of the alkaline earth metal may be at least one of LiF, NaF, KF, RbF, CsF, $MgF_2$, $CaF_2$, $SrF_2$, $BaF_2$, LiCl, NaCl, KCl, RbCl, CsCl, $MgCl_2$, $CaCl_2$, $SrCl_2$, and $BaCl_2$. The metal oxide may be one of an alkali metal and an oxide of the alkali metal. In an implementation, the oxide of the alkali metal may be at least one of Liq, $LiO_2$, $NaO_2$, $BrO_2$, $Cs_2O$, MgO, and CaO.

In an implementation, the electron transport layer ETL may further include a p-type dopant. In an implementation, the p-type dopant may include, e.g., 1,4,5,8,9,11-hexaazatriphenylene-hexacarbonitrile (HAT-CN), NDP9, 2,3,5,6-tetrafluoro-7,7,8,8-tetracyanoquinodimethane (F4-TCNQ), a tetracyanoquinodimethane compound (e.g., tetracyanoquinodimethane and/or derivatives of tetracyanoquinodimethane), iodine, $V_2O_5$, $FeCl_3$, $FeF_3$, or $SbCl_5$. The electron transport layer ETL may include the p-type dopant in an amount of 1 wt % to 2 wt %, based on a total weight of the ETL. The p-type dopant may form electron traps in a first electron transport layer ETL1.

Maintaining the amount of the p-type dopant at 2 wt % or less helps ensure that the electron traps are not excessively formed in the electron transport layer ETL. Therefore, deterioration of the electron transport ability of the electron transport layer ETL may be prevented, and the image quality of the organic light emitting display device may be maintained.

Maintaining the amount of the p-type dopant at 1 wt % or greater may help ensure that a sufficient number of electron traps are formed in the electron transport layer ETL. Therefore, controlling the amount of electrons transported from the electron transport layer ETL to the emitting layer EML may be facilitated. For example, when the organic light emitting display device is to express a low gray scale, controlling the amount of electrons transported to the emitting layer EML may be facilitated.

The electron injection layer EIL may include a suitable electron injection material. For example, the electron injection layer EIL may include LiF, CsF, $Li_2O$, or BaO. In an implementation, the electron injection layer EIL may include an iodine-based compound, Yb, or $YbF_3$. In an implementation, the iodine-based compound may include LiI, NaI, CsI, KI, or RbI.

Each of the red organic light emitting device ROLED and the green organic light emitting device GOLED may include an auxiliary hole transport layer R' or G' disposed between the hole transport layer HTL and the emitting layer REML or GEML. The auxiliary hole transport layer R' or G' may control a resonance period of light emitted from the emitting layer REML or GEML. For example, the auxiliary hole transport layer R' or G' may help improve the color purity of light emitted from the emitting layer REML or GEML. The auxiliary hole transport layer R' or G' may help improve the light emitting efficiency of each of the red organic light emitting device ROLED and the green organic light emitting device GOLED.

In an implementation, the blue organic light emitting device BOLED may include a blue auxiliary layer BIL disposed between the hole transport layer HTL and the emitting layer BEML. The blue auxiliary layer BIL may help control hole charge balance, thereby improving the light generation efficiency of the emitting layer BEML of the blue organic light emitting device BOLED.

The second electrode CE may be a cathode electrode. In an implementation, the second electrode CE is a semi-transmissive reflective layer, and may be a thin metal layer having a particular thickness, through which light can be transmitted. The second electrode CE may include a material having a low work function as compared with the transparent conductive layer. For example, the second electrode CE may include molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof.

The capping layer CPL may isolate the organic light emitting device OLED from an external environment. Thus, the capping layer CPL may be disposed on the second electrode CE, to prevent moisture and oxygen from penetrating into the organic light emitting device OLED.

In the organic light emitting display device, as the electron transport layer ETL includes a p-type dopant, the amount of electrons injected into the emitting layer REML, GEML, and BEML may be controlled. For example, when the organic light emitting display device is to express a low gray scale, the amount of electrons injected into the emitting layer REML, GEML, and BEML may be controlled such that no extra electrons exist in the emitting layer REML, GEML, and BEML. Thus, the organic light emitting display device may implement exact colors.

Figure 6:
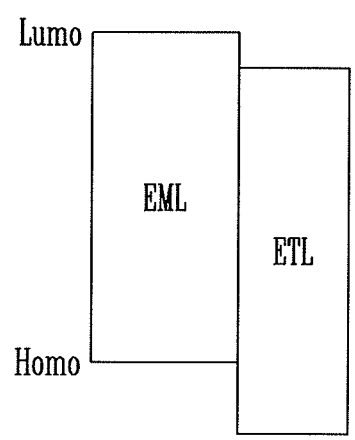
FIG. 6 illustrates an energy diagram of HOMO levels and LUMO levels of an emitting layer and an electron transport layer, shown in FIGS. 3 to 5.

FIG. 6 illustrates an energy diagram of HOMO levels and LUMO levels of the emitting layer and the electron transport layer, shown in FIGS. 3 to 5.

Referring to FIG. 6, when an electron jumps over an electron injection barrier corresponding to a difference between a LUMO level of the electron transport layer ETL and a LUMO level of the emitting layer EML, the electron may be injected into the emitting layer EML from the electron transport layer ETL.

The electron transport layer ETL may include a p-type dopant, and the difference between the LUMO level of the electron transport layer ETL and the LUMO level of the emitting layer EML may increase.

As the content of the p-type dopant is controlled in the electron transport layer ETL, the difference between the LUMO level of the electron transport layer ETL and the LUMO level of the emitting layer EML may be controlled.

For example, as the content of the p-type dopant increases, the difference between the LUMO level of the electron transport layer ETL and the LUMO level of the emitting layer EML may increase.

If the difference between the LUMO level of the electron transport layer ETL and the LUMO level of the emitting layer EML increases, the electron injection barrier increases. Therefore, it may be difficult to transfer electrons from the electron transport layer ETL to the emitting layer EML.

When the organic light emitting display device expresses a high gray scale, a plurality of electrons may be injected into the emitting layer EML by jumping over the electron injection barrier, and thus the deterioration of the light emitting efficiency and image quality of the organic light emitting display device may be decreased.

When the organic light emitting display device expresses a low gray scale, the number of electrons supplied to the electron transport layer ETL may be small, and thus some electrons may be trapped by the p-type dopant. For example, the p-type dopant may help the number of electrons injected into the emitting layer EML, thereby preventing extra electrons from existing in the emitting layer EML. Accordingly, excitons may be prevented from being formed in regions other than the emitting layer EML, so that the organic light emitting device may help prevent a change in image quality.

Hereinafter, organic light emitting display devices according to other embodiments of the present disclosure will be described with reference to FIGS. 7 to 12. In FIGS. 7 to 12, components identical to those shown in FIGS. 1 to 6 are designated by like reference numerals and will briefly described.

Figure 7:
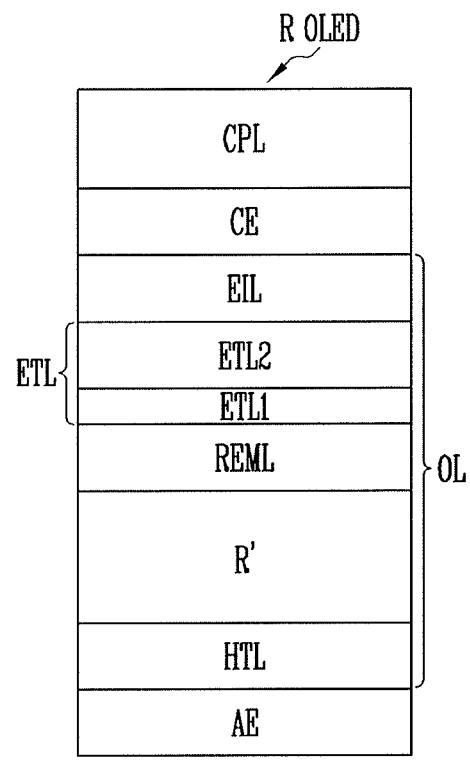
FIGS. 7 to 9 illustrate sectional views of a red organic light emitting device, a green organic light emitting device, and a blue organic light emitting device according to another embodiment of the present disclosure.
Figure 8:
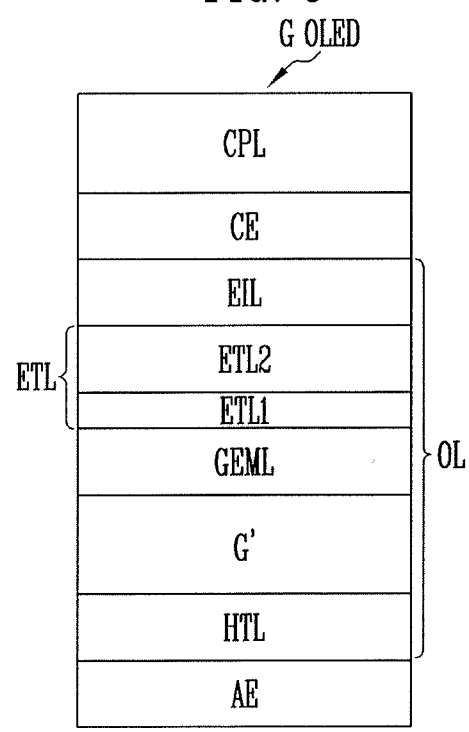
Figure 9:
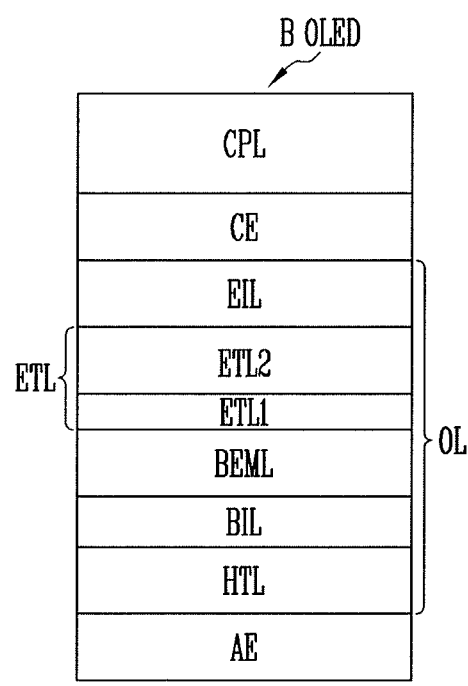

FIGS. 7 to 9 illustrate sectional views of a red organic light emitting device, a green organic light emitting device, and a blue organic light emitting device according to another embodiment of the present disclosure.

Referring to FIGS. 7 to 9, each of the red organic light emitting device ROLED, the green organic light emitting device GOLED, and the blue organic light emitting device BOLED may include a first electrode AE, an organic layer OL disposed on the first electrode AE, a second electrode CE disposed on the organic layer OL, and a capping layer CPL disposed on the second electrode CE.

The organic layer OL may include a hole transport layer HTL disposed on the first electrode AE, an emitting layer REML, GEML, or BEML disposed on the hole transport layer HTL, an electron transport layer ETL disposed on the emitting layer REML, GEML, or BEML, and an electron injection layer EIL disposed on the electron transport layer ETL. Here, the hole transport layer HTL, the electron transport layer ETL, and the electron injection layer EIL may be common layers that are identically applied to both of the red organic light emitting device ROLED, the green organic light emitting device GOLED, and the blue organic light emitting device BOLED.

The electron transport layer ETL may include a first electron transport layer ETL1 disposed between the emitting layer REML, GEML, or BEML and the second electrode CE, and a second electron transport layer ETL2 disposed between the first electron transport layer ETL1 and the second electrode CE. Here, one of the first electron transport layer ETL1 and the second electron transport layer ETL2, e.g., the first electron transport layer ETL1, may include a p-type dopant. In an implementation, in the first electron transport layer ETL1, the content of the p-type dopant may be, e.g., 1 wt % to 2 wt %.

Each of the red organic light emitting device ROLED and the green organic light emitting device GOLED may include an auxiliary hole transport layer R' or G' disposed between the hole transport layer HTL and the emitting layer REML or GEML. The auxiliary hole transport layer R' or G' may help control a resonance period of light emitted from the emitting layer REML or GEML.

In an implementation, the blue organic light emitting device BOLED may include a blue auxiliary layer BIL disposed between the hole transport layer HTL and the emitting layer BEML. The blue auxiliary layer BIL may help control hole charge balance, thereby improving the light generation efficiency of the emitting layer BEML of the blue organic light emitting device BOLED.

In an implementation, the first electron transport layer ETL1 including the p-type dopant may be disposed between the emitting layer REML, GEML, or BEML and the second electron transport layer ETL2. In an implementation, the first electron transport layer ETL1 may be disposed between the second electron transport layer ETL2 and the second electrode CE.

Figure 10:
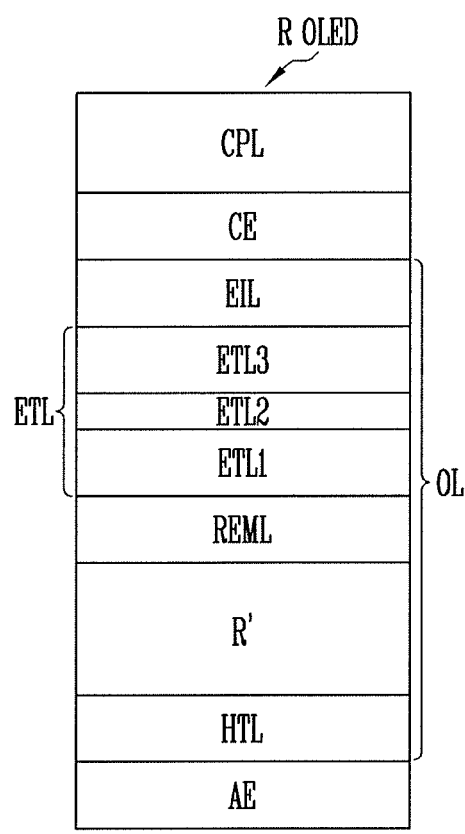
FIGS. 10 to 12 illustrate sectional views of a red organic light emitting device, a green organic light emitting device, and a blue organic light emitting device according to still another embodiment of the present disclosure.
Figure 11:
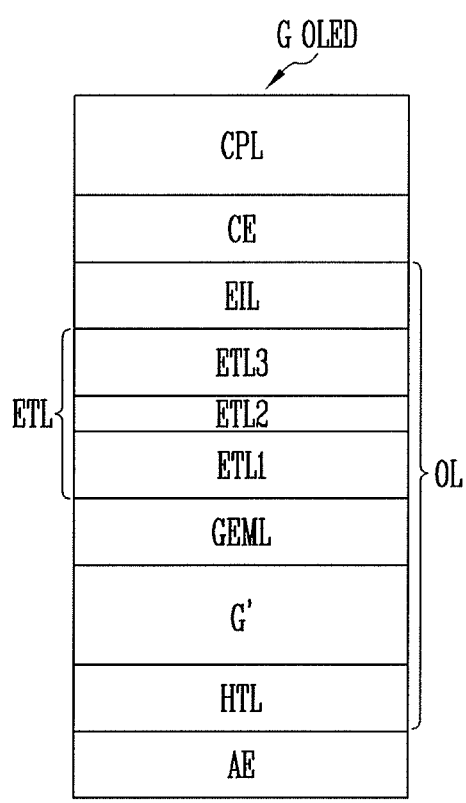
Figure 12:
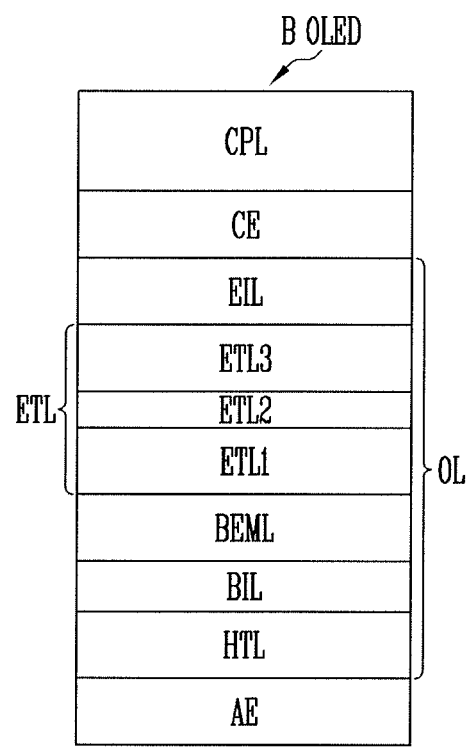

FIGS. 10 to 12 illustrate sectional views of a red organic light emitting device, a green organic light emitting device, and a blue organic light emitting device according to still another embodiment of the present disclosure.

Referring to FIGS. 10 to 12, each of the red organic light emitting device ROLED, the green organic light emitting device GOLED, and the blue organic light emitting device BOLED may include a first electrode AE, an organic layer OL disposed on the first electrode AE, a second electrode CE disposed on the organic layer OL, and a capping layer CPL disposed on the second electrode CE.

The organic layer OL may include a hole transport layer HTL disposed on the first electrode AE, an emitting layer REML, GEML, or BEML disposed on the hole transport layer HTL, an electron transport layer ETL disposed on the emitting layer REML, GEML, or BEML, and an electron injection layer EIL disposed on the electron transport layer ETL. Here, the hole transport layer HTL, the electron transport layer ETL, and the electron injection layer EIL may be common layers that are identically applied to both of the red organic light emitting device ROLED, the green organic light emitting device GOLED, and the blue organic light emitting device BOLED.

In an implementation, the electron transport layer ETL may include a first electron transport layer ETL1 disposed between the emitting layer REML, GEML, or BEML and the second electrode CE, a second electron transport layer ETL2 disposed between the first electron transport layer ETL1 and the second electrode CE, and a third electron transport layer ETL3 disposed between the second electron transport layer ETL2 and the second electrode CE. In an implementation, the second electron transport layer ETL2 may include a p-type dopant. In an implementation, in the second electron transport layer ETL2, the content of the p-type dopant may be 1 wt % to 2 wt %.

Each of the red organic light emitting device ROLED and the green organic light emitting device GOLED may include an auxiliary hole transport layer R' or G' disposed between the hole transport layer HTL and the emitting layer REML or GEML. The auxiliary hole transport layer R' or G' may control a resonance period of light emitted from the emitting layer REML or GEML.

In an implementation, the blue organic light emitting device BOLED may include a blue auxiliary layer BIL disposed between the hole transport layer HTL and the emitting layer BEML. The blue auxiliary layer BIL may help control hole charge balance, thereby improving the light generation efficiency of the emitting layer BEML of the blue organic light emitting device BOLED.

Figure 13:
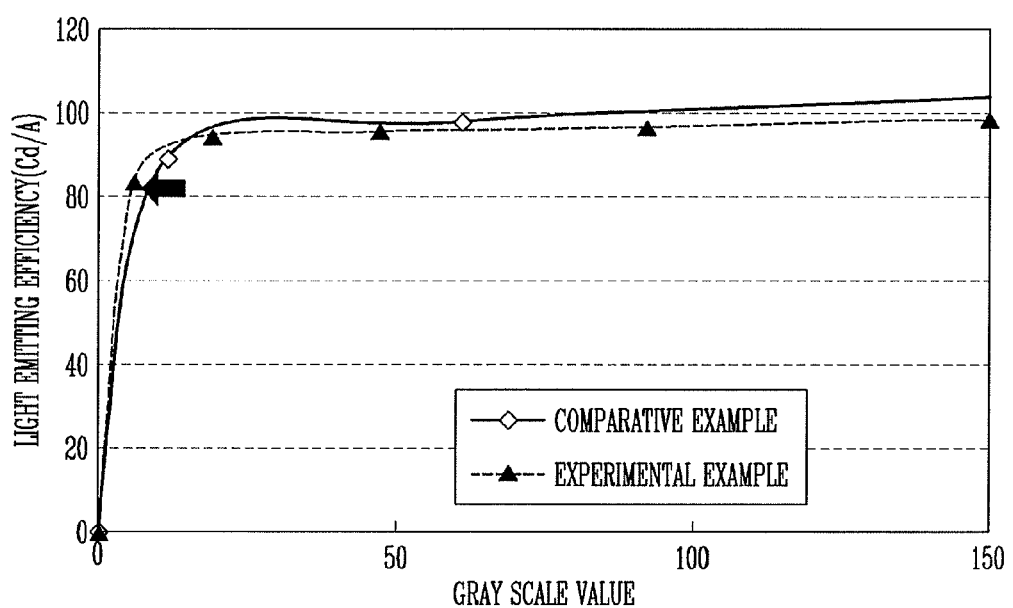
FIG. 13 illustrates a graph showing light emitting efficiency with respect to gray scale in organic light emitting display devices.

FIG. 13 illustrates a graph showing light emitting efficiency with respect to gray scale in organic light emitting display devices. In the graph of FIG. 13, the horizontal axis represents gray scale value, and the vertical axis represents luminance value with respect to current value, i.e., light emitting efficiency. In each of organic light emitting display devices of a Comparative Example and an Experimental Example, which are shown in the graph of FIG. 13, a first electrode included ITO, a hole transport layer included TDP, an emitting layer included $Alq_3$ and DCJTH, an electron injection layer included LiF, and a second electrode included AgMg. In the organic light emitting display device of the Comparative Example, an electron transport layer included $Alq_3$ and LiF. In the organic light emitting display device of the Experimental Example, an electron transport layer included a first electron transport layer including $Alq_3$ and LiF, a second electron transport layer including $Alq_3$, LiF, and NDP9, and a third electron transport layer including $Alq_3$ and LiF.

Referring to FIG. 13, it may be seen that, as the gray scale value increased in a low gray scale of which gray scale value is 20 or less in each of the organic light emitting devices of the Comparative Example and the Experimental Example, the light emitting efficiency of the organic light emitting display device increased. In addition, it may be seen that, as the light emitting efficiency reached a predetermined value, the light emitting efficiency of the organic light emitting display device no longer increased even when the gray scale value increased.

In addition, it may be seen that, as the organic light emitting display devices of the Comparative Example and the Experimental Example express the same gray scale value in a low gray scale of which gray scale value is 20 or less, the light emitting efficiency of the organic light emitting display device of the Experimental Example was superior to that of the organic light emitting display device of the Comparative Example. For example, it may be seen that, if a p-type dopant is included in the electron transport layer, the organic light emitting display device may efficiently express low gray scales.

By way of summation and review, when a low gray scale is expressed in the organic light emitting display device, extra electrons may exist in the light emitting layer. The extra electrons may not be combined with holes in the light emitting layer, and could move in the direction of the anode electrode. For example, excitons could be formed in a region other than the light emitting layer. Therefore, the image quality of the organic light emitting display device could be deteriorated.

As described above, according to the present disclosure, the organic light emitting display device may have a region in which a p-type dopant is doped into at least a portion of the electron transport layer. The p-type dopant in the electron transport layer forms electron traps, thereby preventing extra electrons from existing in the emitting layer. Thus, it is possible to prevent deterioration of the image quality of the organic light emitting display device.

The embodiments may provide an organic light emitting display device capable of preventing deterioration of the image quality thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
   an anode electrode;
   a cathode electrode;
   an emitting layer between the anode electrode and the cathode electrode; and
   an electron transport layer between the cathode electrode and the emitting layer,
   wherein the electron transport layer includes a p-type dopant,
   wherein the p-type dopant is included in the electron transport layer in an amount of 1 wt % to 2 wt %, based on a total weight of the electron transport layer, and
   wherein the p-type dopant includes 1,4,5,8,9,11-hexaaza-triphenylene-hexacarbonitrile (HAT-CN), NDP9, 2,3,5,6-tetrafluoro-7,7,8,8-tetracyanoquinodimethane (F4-TCNQ), a tetracyanoquinodimethane compound, $FeCl_3$, $FeF_3$, or $SbCl_5$.

2. The organic light emitting display device as claimed in claim 1, further comprising a hole transport layer between the anode electrode and the emitting layer, and an auxiliary layer between the hole transport layer and the emitting layer.

3. The organic light emitting display device as claimed in claim 2, wherein the auxiliary layer controls a resonance period of light emitted from the emitting layer.

4. An organic light emitting display device, comprising:
   an anode electrode;
   a cathode electrode;
   an emitting layer between the anode electrode and the cathode electrode; and
   an electron transport layer between the cathode electrode and the emitting layer,
   wherein the electron transport layer includes:
   a first electron transport layer between the cathode electrode and the emitting layer; and
   a second electron transport layer between the cathode electrode and the first electron transport layer,
   wherein at least one of the first electron transport layer and the second electron transport layer includes a p-type dopant, and
   wherein the p-type dopant includes 1,4,5,8,9,11-hexaaza-triphenylene-hexacarbonitrile (HAT-CN), NDP9, 2,3,5,6-tetrafluoro-7,7,8,8-tetracyanoquinodimethane (F4-TCNQ), a tetracyanoquinodimethane compound, $FeCl_3$, $FeF_3$, or $SbCl_5$.

5. The organic light emitting display device as claimed in claim 4, wherein the first electron transport layer includes the p-type dopant.

6. The organic light emitting display device as claimed in claim 5, wherein the p-type dopant is included in the first electron transport layer in an amount of 1 wt % to 2 wt %, based on a total weight of the first electron transport layer.

7. The organic light emitting display device as claimed in claim 4, wherein the second electron transport layer includes the p-type dopant.

8. The organic light emitting display device as claimed in claim 7, wherein the electron transport layer further includes a third electron transport layer between the second electron transport layer and the cathode electrode.

9. The organic light emitting display device as claimed in claim 7, wherein the p-type dopant is included in the second electron transport layer in an amount of 1 wt % to 2 wt %, based on a total weight of the second electron transport layer.

10. The organic light emitting display device as claimed in claim 4, further comprising a hole transport layer between the anode electrode and the emitting layer, and an auxiliary layer between the hole transport layer and the emitting layer.

11. The organic light emitting display device as claimed in claim 10, wherein the auxiliary layer controls a resonance period of light emitted from the emitting layer.

* * * * *